United States Patent
Nakagawa et al.

(10) Patent No.: US 7,550,709 B2
(45) Date of Patent: Jun. 23, 2009

(54) SOLID-STATE IMAGING DEVICE AND METHOD FOR FABRICATING THE SAME

(75) Inventors: Atsuo Nakagawa, Osaka (JP); Mamoru Honjo, Osaka (JP); Yoshiaki Nishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 11/708,465

(22) Filed: Feb. 21, 2007

(65) Prior Publication Data

US 2007/0221829 A1    Sep. 27, 2007

(30) Foreign Application Priority Data

Mar. 24, 2006    (JP) .............................. 2006-082882

(51) Int. Cl.
*H01J 3/14* (2006.01)

(52) U.S. Cl. ...................................... 250/226; 348/336

(58) Field of Classification Search ................. 250/226; 348/336; 359/634; 257/184

See application file for complete search history.

(56) References Cited

U.S. PATENT DOCUMENTS

| | | | | |
|---|---|---|---|---|
| 3,821,549 A | * | 6/1974 | Gloge | 250/214 R |
| 4,709,144 A | * | 11/1987 | Vincent | 250/226 |
| 4,806,750 A | * | 2/1989 | Vincent | 250/226 |
| 5,784,202 A | * | 7/1998 | Noguchi | 359/618 |
| 2005/0275806 A1 | * | 12/2005 | Roth | 353/20 |

FOREIGN PATENT DOCUMENTS

| JP | 8-54623 A | 2/1996 |
|---|---|---|
| JP | 3617692 B2 | 11/2004 |

* cited by examiner

*Primary Examiner*—Georgia Y Epps
*Assistant Examiner*—Tony Ko
(74) *Attorney, Agent, or Firm*—McDermott Will & Emery LLP (57) ABSTRACT

A solid-state imaging device includes: a plurality of light-receiving parts arranged in an array in a substrate and performing photoelectric conversion on incident light; and a plurality of color separators each provided for adjacent four of the light-receiving parts arranged in two rows and two columns. Each of the color separators includes first through fourth color-separating elements and first and second mirror elements.

9 Claims, 10 Drawing Sheets

SOLID-STATE IMAGING DEVICE AND METHOD FOR FABRICATING THE SAME

CROSS-REFERENCE TO RELATED APPLICATION

The disclosure of Japanese Patent Application No. 2006-082882 filed in Japan on Mar. 24, 2006 including specification, drawings and claims is incorporated herein by reference in its entirety.

BACKGROUND OF THE INVENTION (1) Field of the Invention

The present invention relates to solid-state imaging devices and methods for fabricating the devices, and particularly relates to a solid-state imaging device including transmission color filters in a Bayer pattern and a method for fabricating the device.

(2) Background Art

Solid-state imaging devices such as CCD solid-state imaging devices and MOS solid-state imaging devices are used for various image input equipment such as video cameras, digital still cameras and facsimiles.

To obtain a color image in a solid-state imaging device, it is necessary to decompose light incident on the solid-state imaging device into color components and then make the respective color components enter light-receiving parts for performing photoelectric conversion. Color components are generally separated by using absorption color filters (color separators) respectively associated with three colors of red (R), green (G) and blue (B). A green absorption filter, for example, absorbs red light and blue light and transmits only green light. Accordingly, when light passes through the absorption color filter, two-thirds of the light is disadvantageously absorbed, so that the sensitivity of the solid-state imaging device decreases.

On the other hand, transmission color filters are used in, for example, display apparatus. The transmission color filters are formed in combination with dichroic mirrors each of which transmits light with a specific wavelength and reflects light with the other wavelengths (see, for example, Japanese Unexamined Patent Publication No. 8-54623). Accordingly, in the case of applying transmission color filters to a solid-state imaging device, if a dichroic mirror which transmits only green light, for example, is used to separate green light and make the green light enter a light-receiving part and reflected light from which the green light has been separated is further separated and caused to enter other light-receiving parts, light incident on the solid-state imaging device is used without waste.

However, when the conventional transmission color filters are used in a solid-state imaging device, the following problems arise. The solid-state imaging device uses color filters in a Bayer pattern in which four light-receiving parts arranged in two rows and two columns are generally used as a set so that light which has passed through green filters enters two of the light-receiving parts and light which has passed through red and blue filters enters the other two light-receiving parts. This is because human vision has higher sensitivity to green light and, therefore, the number of light-receiving parts which receive green light is increased so as to enhance the resolution of an image. However, the conventional transmission color filters separate incident light into three light beams of red, green and blue. Accordingly, light-receiving parts which respectively receive red, green and blue light beams are arranged in a line, thus making it difficult to arrange color filters in a Bayer pattern.

SUMMARY OF THE INVENTION

It is therefore an object of the present invention to provide a solid-state imaging device including transmission color filters in a Bayer pattern.

To achieve the object, according to the present invention, a solid-state imaging device includes four dichroic mirror elements and two mirror elements.

Specifically, a solid-state imaging device according to the present invention includes: a plurality of light-receiving parts arranged in an array in a substrate and performing photoelectric conversion on incident light; and a plurality of color separators each provided for adjacent four of the light-receiving parts arranged in two rows and two columns, wherein the four light-receiving parts are a first light-receiving part, a second light-receiving part, a third light-receiving part and a fourth light-receiving part, each of the color separators includes a first optical element part for guiding incident light to a first optical path entering the first light-receiving part, a second optical element part for guiding incident light to the fourth light-receiving part located in a row and a column which are different from a row and a column on which the first light-receiving part is located, a first color-separating element formed on the first optical path between the first optical element part and the first light-receiving part, reflecting light of one of red, green and blue included in incident light toward the third light-receiving part located in the row on which the first light-receiving part is located and a column different from the column on which the first light-receiving part located, guiding the reflected light to a third optical path crossing the first optical path, and transmitting light of the other two colors, a second color-separating element formed on the second optical path between the second optical element part and the fourth light-receiving part, reflecting light of one of red, green and blue included in incident light toward the second light-receiving part located in the column on which the first light-receiving part is located and a row different from the row on which the first light-receiving part is located, guiding the reflected light to a fourth optical path crossing the second optical path, and transmitting light of the other two colors, a third color-separating element formed on the first optical path between the first color-separating element and the first light-receiving part, reflecting light of one of two colors included in light which has passed through the first color-separating element, guiding the reflected light to a fifth optical path crossing the first optical path, and allowing light of the other color to pass and enter the first light-receiving part, a fourth color-separating element formed on the second optical path between the second color-separating element and the third light-receiving part, reflecting light of one of two colors included in light which has passed through the second color-separating element, guiding the reflected light to a sixth optical path crossing the second optical path, allowing light of the other color to pass and enter the fourth-light-receiving part, a first mirror element formed on the third optical path, reflecting light guided to the third optical path, and guiding the reflected light to a seventh optical path entering the third light-receiving part, and a second mirror element formed on the fourth optical path, reflecting light guided to the fourth optical path, and guiding the reflected light to an eighth optical path entering the second light-receiving part, the color of light reflected by the first color-separating element and the color of light reflected by the second color-separating element differ from each other, and the color of light transmitted through the third color-separating element and the color of light transmitted through the fourth color-separating element are identical.

In the color separator formed for each four light-receiving parts of the solid-state imaging device, the color of light reflected by the first color-separating element differs from that of light reflected by the second color-separating element, and the color of light transmitted through the third color-separating element is identical to that of light transmitted through the fourth color-separating element. Accordingly, light of the same color enters two of the four light-receiving parts and light of different colors respectively enters the other two light-receiving parts. As a result, transmission color filters are allowed to be arranged in a Bayer pattern, thus implementing a solid-state imaging device with high sensitivity.

Preferably, in the solid-state imaging device, the first color-separating element reflects blue light, the second color-separating element reflects red light, and the third color-separating element and the fourth color-separating element transmit green light. With this configuration, a primary color Bayer pattern is achieved.

In the solid-state imaging device, each of the first optical element part and the second optical element part preferably includes: a microlens element for focusing incident light; and a collimator element for forming light focused by the microlens element into parallel light.

Preferably, in the solid-state imaging device, the fifth optical path and the eighth optical path intersect, the sixth optical path and the seventh optical path intersect, a first halfmirror element for transmitting light traveling on the eighth optical path and for reflecting part of light traveling on the fifth optical path to have the reflected light enter the second light-receiving part is formed at an intersection of the fifth optical path and the eighth optical path, a second halfmirror element for transmitting light traveling on the seventh optical path and for reflecting part of light traveling on the sixth optical path to have the reflected light enter the third light-receiving part is formed at an intersection of the sixth optical path and the seventh optical path, a first light-absorbing part for absorbing light is formed on the fifth optical path at a side opposite the third color-separating element with respect to the first halfmirror element, and a second light-absorbing part for absorbing light is formed on the sixth optical path at a side opposite the fourth color-separating element with respect to the second halfmirror element. With this configuration, light reflected by the third and fourth color-separating elements is also utilized, thus further enhancing the sensitivity of the solid-state imaging device. In addition, color mixture caused by entering of light reflected by the third and fourth color-separating elements into other light-receiving parts is suppressed.

Preferably, in the solid-state imaging device, the fifth optical path and the eighth optical path intersect, the sixth optical path and the seventh optical path intersect, a first beam splitter element is formed at an intersection of the fifth optical path and the eighth optical path, a second beam splitter element is formed at an intersection of the sixth optical path and the seventh optical path, a first polarizer is formed on the fifth optical path between the third color-separating element and the first beam splitter element, a second polarizer is formed on the sixth optical path between the fourth color-separating element and the second beam splitter element, a third polarizer is formed on the seventh optical path between the first mirror element and the second beam splitter element, and a fourth polarizer is formed on the eighth optical path between the second mirror element and the first beam splitter element. With this configuration, light focused in the optical element part is used without waste.

The solid-state imaging device preferably further includes: a first light-blocking film formed around each of the color separators; and a second light-blocking film formed in regions where the color separators are provided and preventing transmission of light in regions other than the first optical path, the second optical path, the third optical path, the fourth optical path, the fifth optical path, the sixth optical path, the seventh optical path and the eighth optical path. With this configuration, occurrence of color mixture is further suppressed.

In this case, the second light-blocking film is preferably made of one of a material which absorbs light and a material which reflects light. Alternatively, a configuration in which an intermediate film transmitting light is formed in regions of each of the color separators serving as the first optical path, the second optical path, the third optical path, the fourth optical path, the fifth optical path, the sixth optical path, the seventh optical path and the eighth optical path, the second light-blocking film is made of a material having a refractive index lower than that of the intermediate film, and the intermediate film serves as a light waveguide may be adopted.

The solid-state imaging device preferably further includes: a first primary-color filter formed between the third color-separating element and the first light-receiving part and associated with the color of light incident on the first light-receiving part; a second primary-color filter formed between the first mirror element and the second light-receiving part and associated with the color of light incident on the second light-receiving part; a third primary-color filter formed between the second mirror element and the third light-receiving part and associated with the color of light incident on the third light-receiving part; and a fourth primary-color filter formed between the fourth color-separating element and the fourth light-receiving part and associated with the color of light incident on the fourth light-receiving part. With this configuration, occurrence of color mixture is suppressed.

A method for fabricating a solid-state imaging device according to the present invention includes the steps of: forming a plurality of light-receiving parts in an array in a semiconductor substrate; forming a first prism formation film on the semiconductor substrate and then patterning the first prism formation film, thereby forming first prisms having slopes above respective light-receiving parts arranged in every other row and every other column out of the plurality of light-receiving parts; forming a first dielectric film on the slopes of the first prisms, thereby forming a lower color-separating element transmitting light of a first color of the three primary colors of light; forming an interlayer insulating film covering the lower color-separating element on the semiconductor substrate; forming a second prism formation film on the interlayer insulating film and then patterning the second prism formation film, thereby forming second prisms having slopes above the respective light-receiving parts; forming a second dielectric film on the slopes of second prisms formed on the lower color-separating element and located above one of odd-number rows and even-number rows out of the second prisms, thereby forming first upper color-separating elements transmitting light of the first color and a second color of the three primary colors of light and reflecting light of a third color of the three primary colors of light toward a direction entering an adjacent one of the second prisms in a column direction; forming a third dielectric film on the slopes of second prisms formed on the lower color-separating element and located above the other of the odd-number rows and the even-number rows out of the second prisms, thereby forming second upper color-separating elements transmitting light of the first and third colors and reflecting light of the second color toward a direction entering an adjacent one of the second prisms in the column direction; and forming a fourth dielectric film on the slopes of second prisms other than the second prisms formed above the lower color-separating element out of the second prisms, thereby forming mirror elements each for reflecting, in a direction crossing the substrate, light reflected by one of the first upper color-separating element and the second upper color-separating element.

The method for fabricating a solid-state imaging device according to the present invention enables effective formation of color separating elements and mirror elements. Accordingly, a solid-state imaging device including transmission color filters in a Bayer pattern is easily fabricated.

BRIEF DESCRIPTION OF THE DRAWINGS

FIGS. 6A and 6B illustrate another example of the solid-state imaging device.

FIGS. 7A and 7B illustrate another example of the solid-state imaging device.

FIGS. 10A and 10B are cross-sectional views showing respective process steps of the method for fabricating a solid-state imaging device of the embodiment in the order of fabrication.

DETAILED DESCRIPTION OF THE INVENTION

Figure 1:
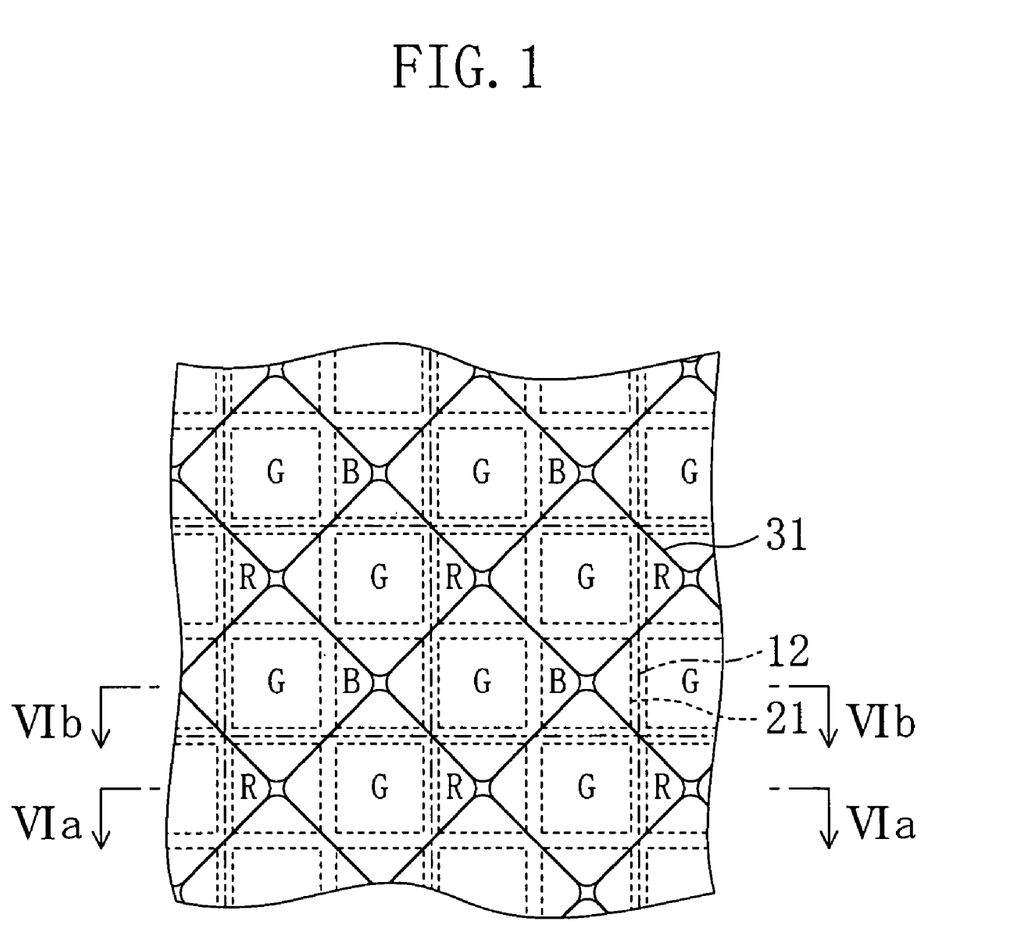
FIG. 1 is a plan view illustrating a solid-state imaging device according to an embodiment of the present invention.
Figure 2:
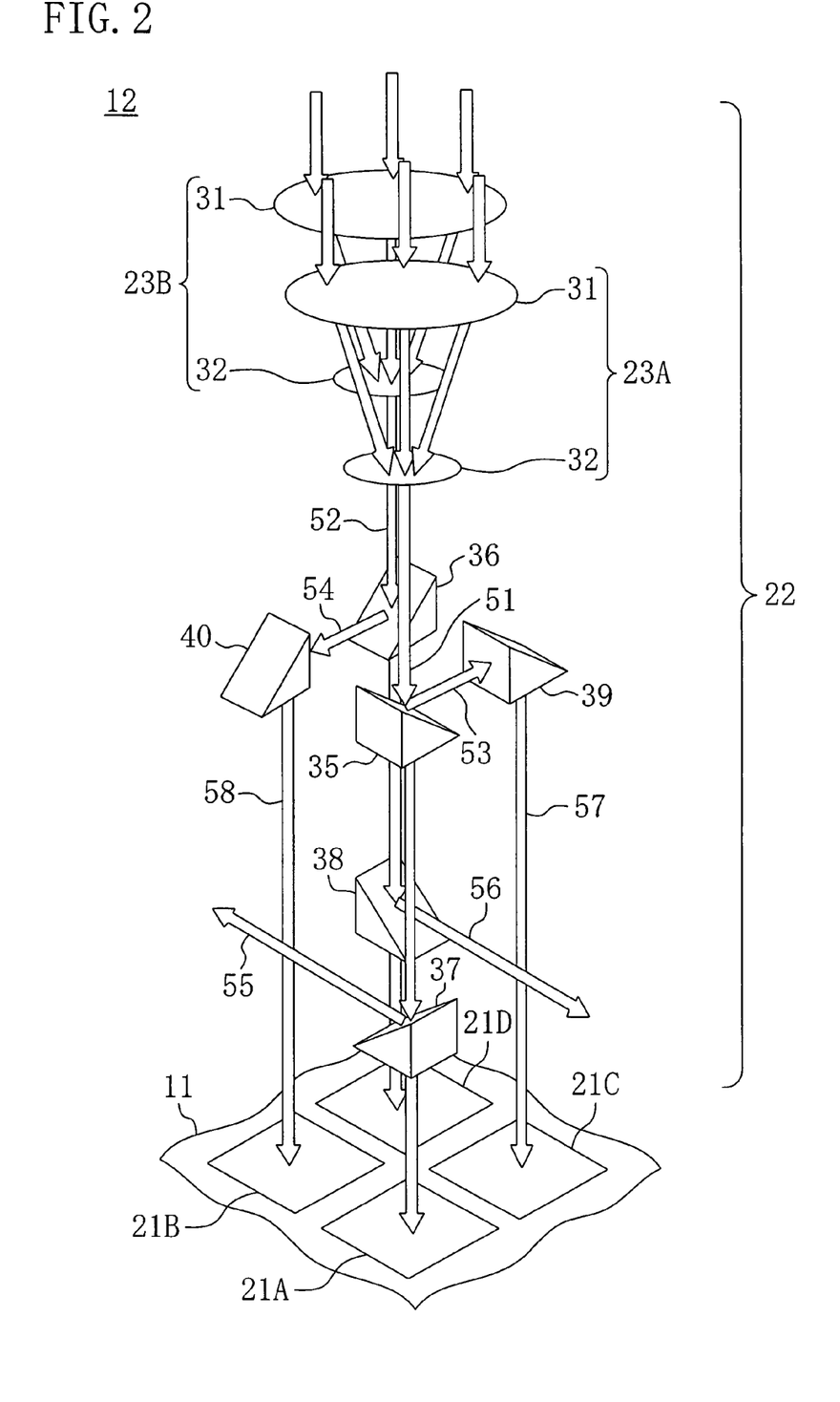
FIG. 2 is a perspective view illustrating the solid-state imaging device of the embodiment.

An embodiment of the present invention will be described with reference to the drawings. FIGS. 1 and 2 illustrate basic configurations of a solid-state imaging device according to this embodiment. FIG. 1 shows a plan configuration and FIG. 2 shows a special configuration. In FIG. 2, an intermediate film and other components are not shown for simplicity.

As illustrated in FIGS. 1 and 2, the solid-state imaging device of this embodiment includes a plurality of light-receiving parts 21 arranged in an array in a substrate 11. A color separator (a transmission color filter) 22 is formed for every four of the light-receiving parts 21 arranged in two rows and two columns. Four light-receiving parts 21 and one color separator 22 constitute a base unit 12.

The four light-receiving parts 21 included in the base unit 12 are first and fourth light-receiving parts 21A and 21D for receiving green light, a second light-receiving part 21B for receiving red light and a third light-receiving part 21C for receiving blue light.

A first optical element part 23A is formed above the first light-receiving part 21A. A second optical element part 23B is formed above the fourth light-receiving part 21D. Each of the first optical element part 23A and the second optical element part 23B includes: an on-chip microlens 31 for focusing light; and a collimator element 32 for forming the light focused by the on-chip microlens 31 into parallel light. The collimator element 32 may be a concave lens, for example.

Figure 3:
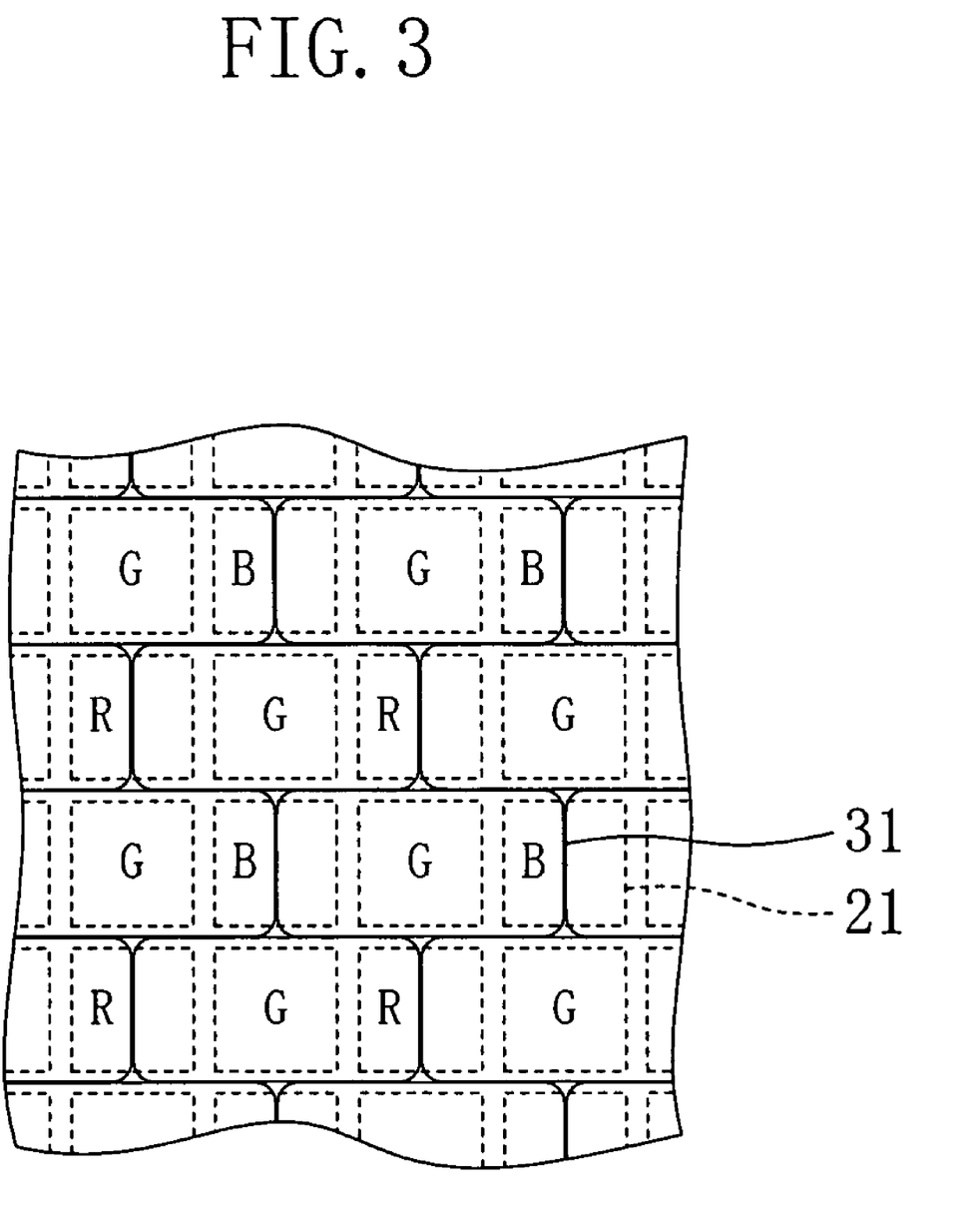
FIG. 3 is a plan view illustrating another example of the solid-state imaging device.

The on-chip microlens 31 of the first optical element part 23A is oriented such that the center of the optical axis thereof coincides with the center of the first light-receiving part 21A. The on-chip microlens 31 of the second optical element part 23B is oriented such that the center of the optical axis thereof coincides with the center of the fourth light-receiving part 21D. For example, it is preferable that the on-chip microlens 31 is a square in plan view and is inclined 45° with respect to the direction of arrangement of the light-receiving parts 21. Then, the entire effective pixel region where the light-receiving parts 21 are arranged is covered without waste. As illustrated in FIG. 3, the on-chip microlens 31 may be a rectangular in plan view.

Incident light which has been formed into parallel light by the collimator element 32 of the first optical element part 23A is guided to a first optical path 51 and enters a first color-separating element 35 formed on the first optical path 51. The first color-separating element 35 is a dichroic mirror which transmits green light and red light and reflects blue light. Then, blue light is reflected in parallel with the substrate toward the third light-receiving part 21C and is guided to a third optical path 53 crossing the first optical path 51.

Incident light which has been formed into parallel light by the collimator element 32 of the second optical element part 23B is guided to a second optical path 52 and enters a second color-separating element 36. The second color-separating element 36 is a dichroic mirror which transmits green light and blue light and reflects red light. Then, red light is reflected in parallel with the substrate toward the second light-receiving part 21B and is guided to a fourth optical path 54 crossing the second optical path 52.

Light transmitted through the first color-separating element 35 enters a third color-separating element 37. The third color-separating element 37 is a dichroic mirror which transmits only green light and reflects red light. Green light transmitted through the third color-separating element 37 enters the first light-receiving part 21A, and red light is reflected in parallel with the substrate 11 toward the second light-receiving part 21B and is guided to a fifth optical path 55.

Light transmitted through the second color-separating element 36 enters a fourth color-separating element 38. The fourth color-separating element 38 is a dichroic mirror which transmits only green light and reflects blue light. Green light transmitted through the fourth color-separating element 38 enters the fourth light-receiving part 21D, and blue light is reflected in parallel with the substrate 11 toward the third light-receiving part 21C and is guided to a sixth optical path 56.

A first mirror element 39 is formed on the third optical path 53 above the third light-receiving part 21C. Light traveling on the third optical path 53 is reflected vertically to the substrate toward the third light-receiving part 21C and is guided to a seventh optical path 57. Then, blue light enters the third light-receiving part 21C.

A second mirror element 40 is formed on the fourth optical path 54 above the second light-receiving part 21B. Light traveling on the fourth optical path 54 is reflected vertically to the substrate toward the second light-receiving part 21B and is guided to an eighth optical path 58. Then, red light enters the second light-receiving part 21B.

In this embodiment, each of the reflective surfaces of the first color-separating element 35, the second color-separating element 36, the third color-separating element 37, the fourth color-separating element 38, the first mirror element 39 and the second mirror element 40 is oriented at 45° with respect to the substrate 11. Then, light is separated into two directions, i.e., directions horizontal and vertical to the substrate 11, so that the thickness of the solid-state imaging device is reduced. It should be noted that if the angle of a reflective surface with respect to the substrate 11 is in the range from about 30° to about 60°, the thickness of the solid-state imaging device is substantially negligible. On the other hand, the transmission wavelength range of a dichroic mirror as a stack of dielectric films depends on the polarization direction and incident angle of incident light. In consideration of this dependence, the angle of a reflective surface with respect to the substrate 11 is preferably 30° or less. In this case, though the thickness of the solid-state imaging device is large, the property of separating color components is advantageously enhanced.

In the solid-state imaging device of this embodiment, red light and blue light reflected by the third color-separating element 37 and the fourth color-separating element 38, respectively, travel only in the direction parallel to the substrate 11. Accordingly, these red light and blue light are not used and, in addition, might enter light-receiving parts of another adjacent base unit to cause color mixture.

Figure 4:
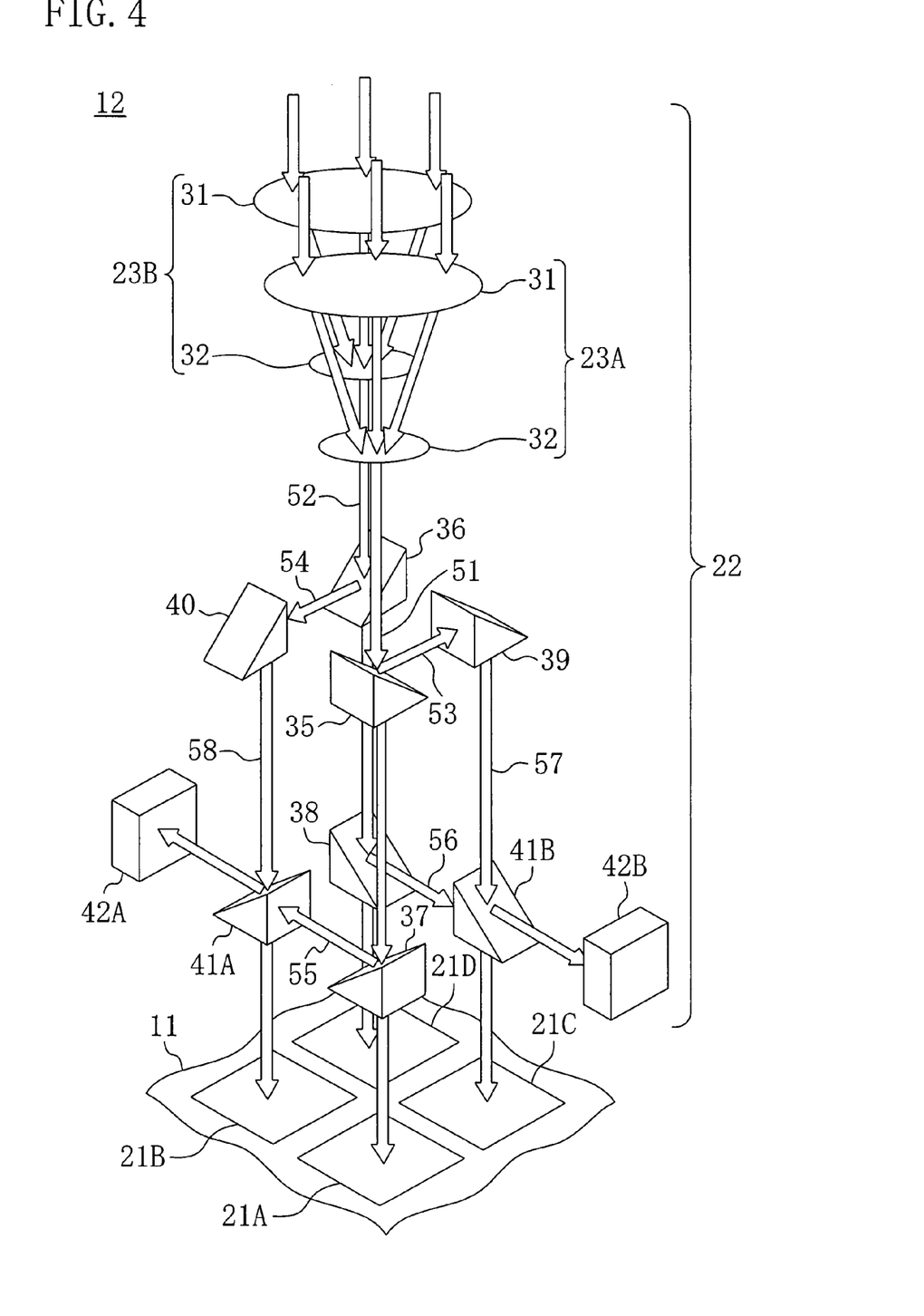
FIG. 4 is a perspective view illustrating another example of the solid-state imaging device.

In view of this, as illustrated in FIG. 4, it is preferable that a first halfmirror element 41A is formed at an intersection of the fifth optical path 55 on which red light reflected by the third color-separating element 37 travels and the eighth optical path 58 on which red light reflected by the second mirror element 40 travels and a first light-absorbing part 42A is formed on the fifth optical path 55 at the side opposite the third color-separating element 37 with respect to the first halfmirror element 41A. Likewise, it is also preferable that a second halfmirror element 41B is formed at an intersection of the sixth optical path 56 on which blue light reflected by the fourth color-separating element 38 travels and the seventh optical path 57 on which blue light reflected by the first mirror element 39 travels and a second light-absorbing part 42B is formed on the sixth optical path 56 at the side opposite the fourth color-separating element 38 with respect to the second light-absorbing part 42B.

This configuration allows about a half of light traveling on the fifth optical path 55 and the sixth optical path 56 to be used, thus reducing the possibility of color mixture.

Figure 5:
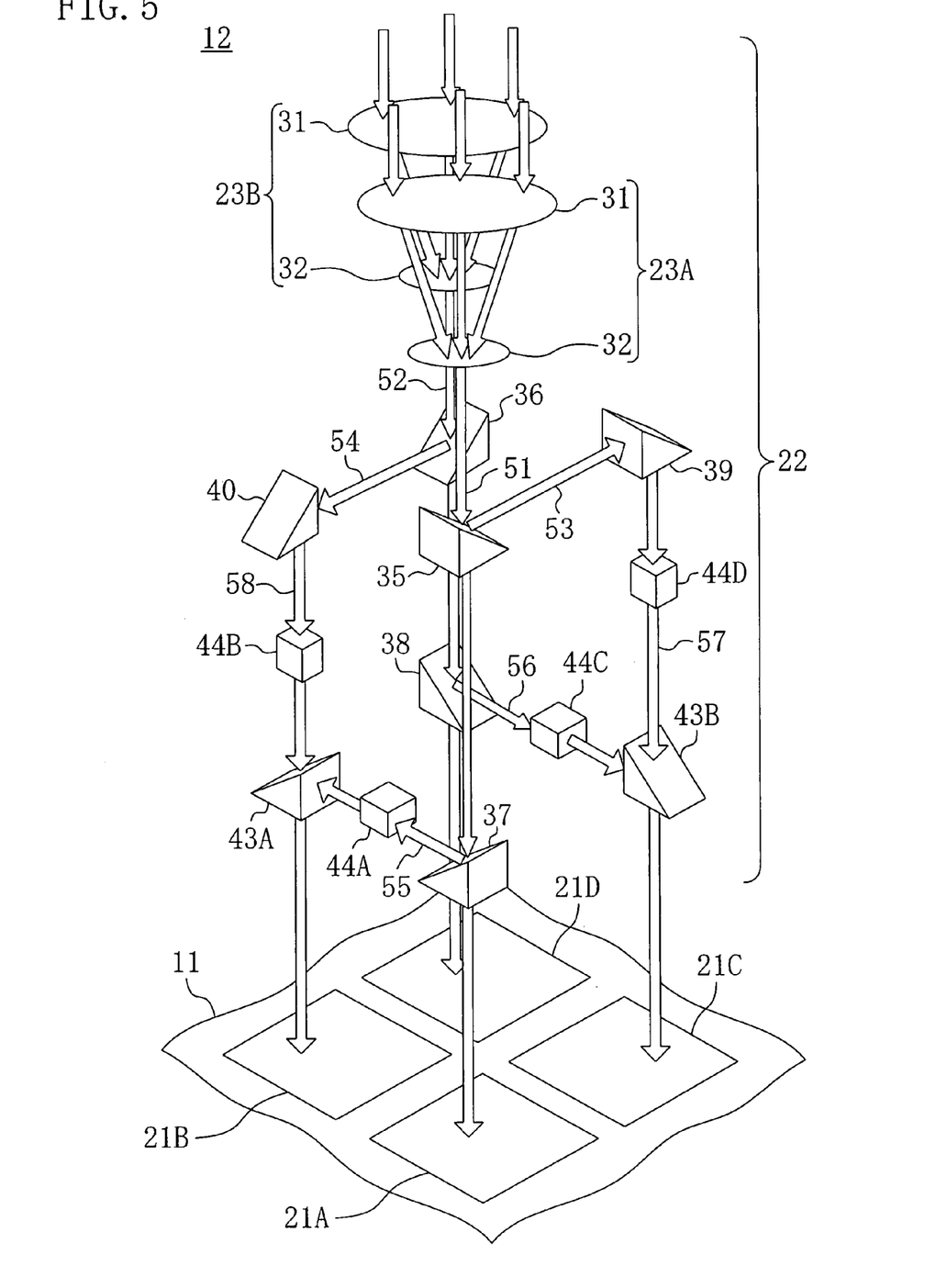
FIG. 5 is a perspective view illustrating another example of the solid-state imaging device.

Alternatively, a configuration as illustrated in FIG. 5 may be employed. In this case, a polarizer 44A is formed on the fifth optical path 55 and a polarizer 44B is formed on the eighth optical path 58 so that polarized electromagnetic radiation of light traveling on the fifth optical path 55 and polarized electromagnetic radiation of light traveling on the eighth optical path 58 are orthogonal to each other. In addition, a first polarizing beam splitter element 43A is formed at an intersection of the fifth optical path 55 and the eighth optical path 58 so that light traveling on the fifth optical path 55 is reflected toward the second light-receiving part 21B and light traveling on the eighth optical path 58 is transmitted without change.

Likewise, a polarizer 44C is formed on the sixth optical path 56, a polarizer 44D is formed on the seventh optical path 57 and a second polarizing beam splitter element 43B is formed at an intersection of the sixth optical path 56 and the seventh optical path 57. This configuration allows all the light focused by the first optical element part 23A and the second optical element part 23B to enter the light-receiving parts and reduces the possibility of color mixture.

Figure 6A:
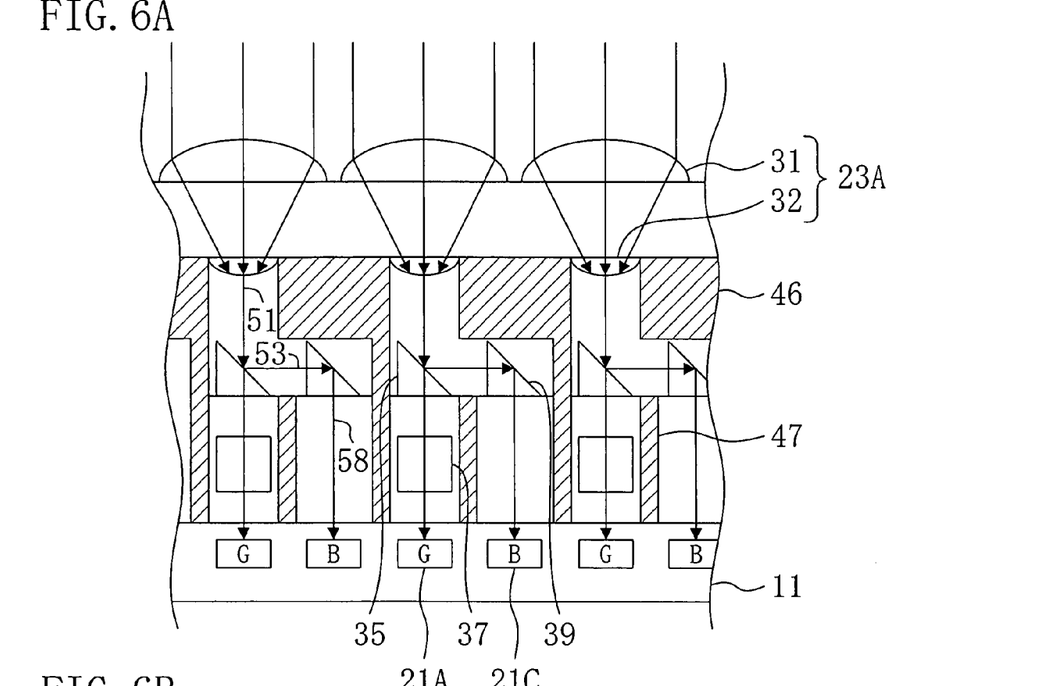
FIG. 6A is a cross-sectional view taken along the line VIa-VIa in FIG. 1
Figure 6B:
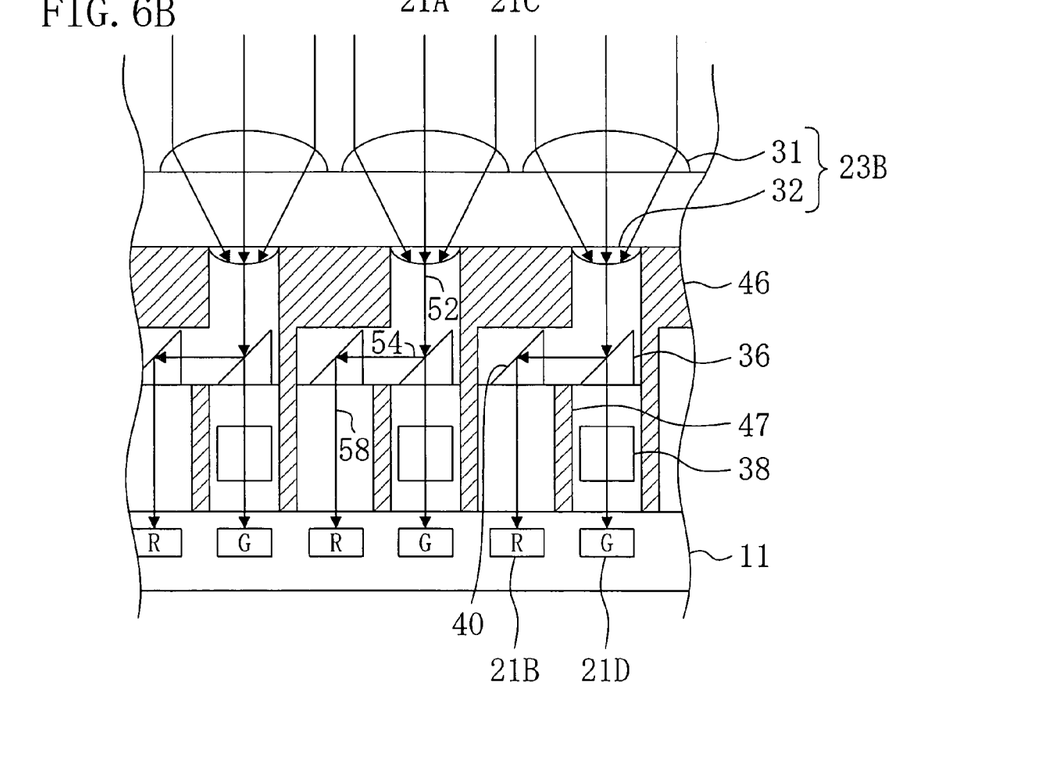
FIG. 6B is a cross-sectional view taken along the line VIb-VIb in FIG. 1.

As illustrated in FIGS. 6A and 6B, a light-blocking wall 46 may be provided between adjacent color separators and a light-blocking wall 47 may be provided in a portion excluding the optical paths. The light-blocking wall 46 and the light-blocking wall 47 may be made of materials which absorb light or materials which reflect light. Each of the light-blocking walls 46 and 47 may be made of a material having a refractive index lower than an intermediate film formed in portions serving as the optical paths so that the optical paths have waveguide structures to perform light confinement.

Figure 7A:
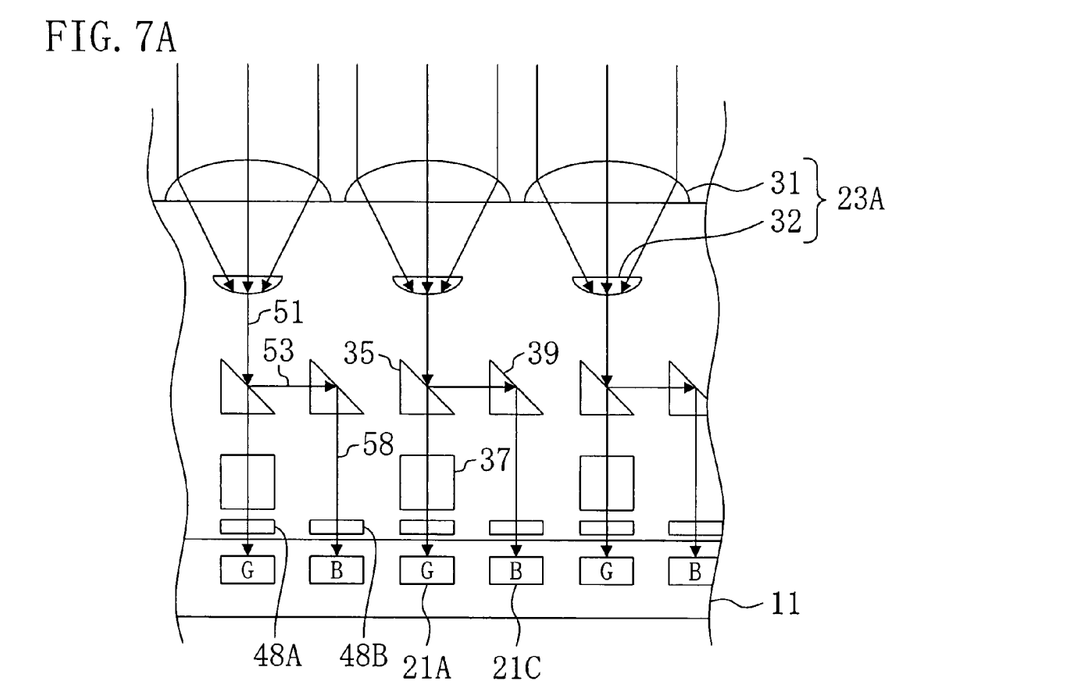
FIG. 7A is a cross-sectional view taken along the line VIa-VIa in FIG. 1
Figure 7B:
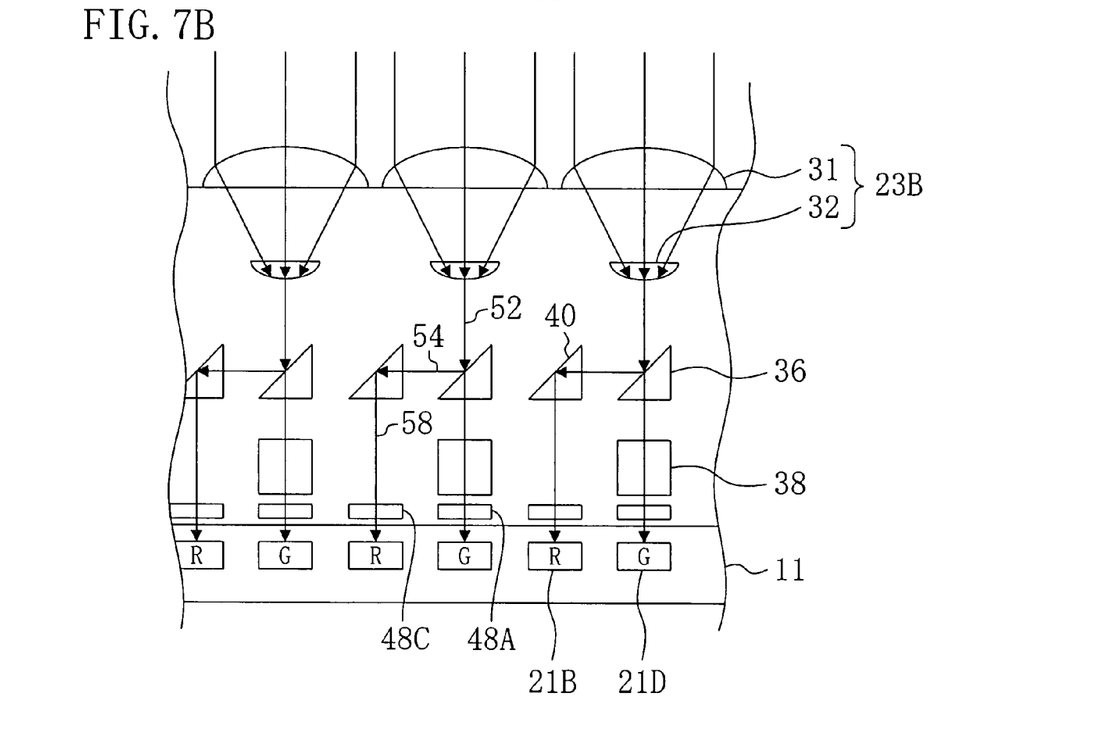
FIG. 7B is a cross-sectional view taken along the line VIb-VIb in FIG. 1.

As illustrated in FIGS. 7A and 7B, a configuration in which first primary-color filters 48A for green are formed between the third color-separating element 37 and the first light-receiving part 21A and between the fourth color-separating element 38 and the fourth light-receiving part 21D, a second primary-color filter 48B for blue is formed between the first mirror element 39 and the third light-receiving part 21C and a third primary-color filter 48C for red is formed between the second mirror element 40 and the second light-receiving part 21B may be employed. This configuration suppresses occurrence of color mixture. Formation of the primary-color filters and the light-blocking walls may be combined.

Hereinafter, a method for fabricating a solid-state imaging device according to this embodiment will be described with reference to the drawings. FIGS. 8A through 8C, FIGS. 9A through 9C and FIGS. 10A and 10B are cross-sectional views showing respective process steps of the method for fabricating a solid-state imaging device of this embodiment in the order of fabrication. FIG. 10A is a cross-sectional view taken along the line Xa-Xa in FIG. 9C. FIG. 10B is a cross-sectional view taken along the line Xb-Xb in FIG. 9C.

Figure 8A:
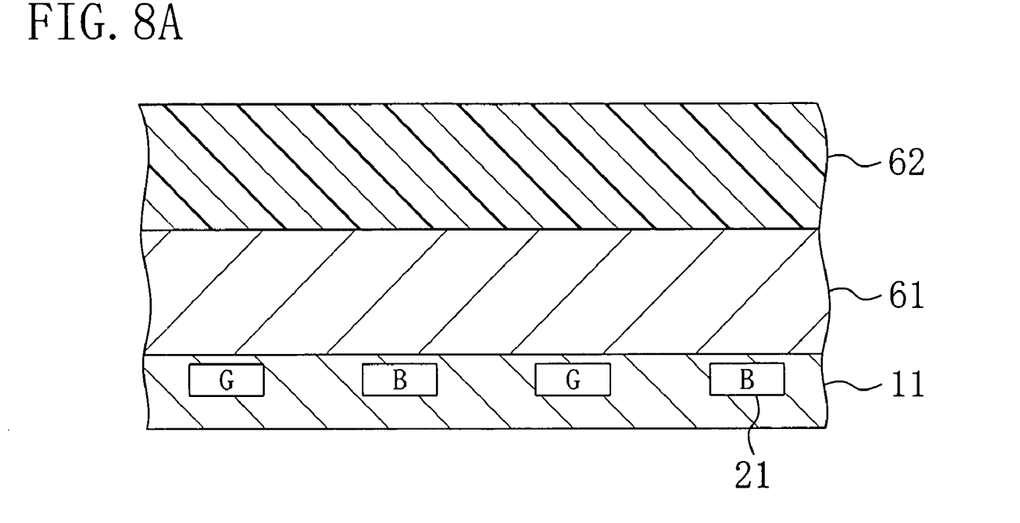
FIGS. 8A through 8C are cross-sectional views showing respective process steps of a method for fabricating a solid-state imaging device according to an embodiment of the present invention in the order of fabrication.

First, as shown in FIG. 8A, a plurality of light-receiving parts 21 are formed in an array in a semiconductor substrate 11. Then, a transparent first prism formation film 61 made of, for example, silicon dioxide ($SiO_2$) is formed on the substrate 11. Thereafter, a synthetic resin film 62 made of, for example, acrylic resin containing melamine as a binder is formed on the first prism formation film 61. The synthetic resin film 62 may be formed by, for example, spin coating.

Figure 8B:
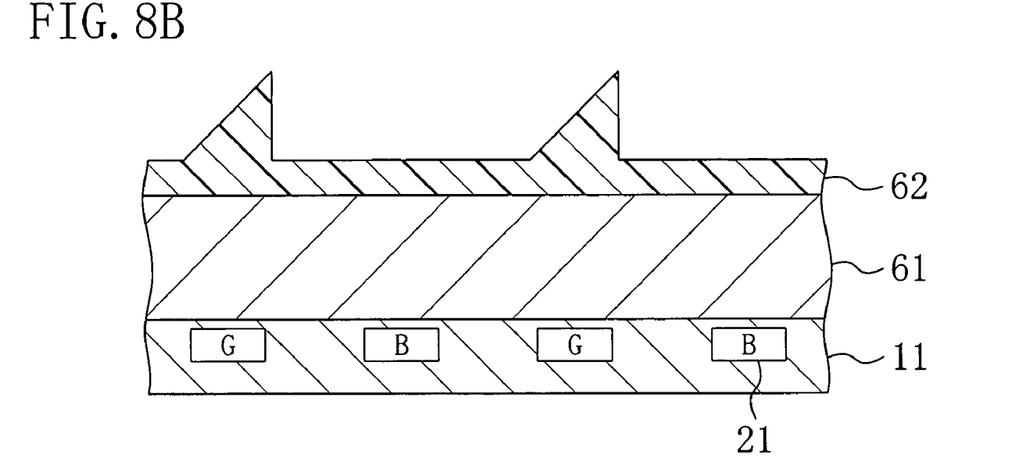

Next, as shown in FIG. 8B, the synthetic resin film 62 is dried at low temperature, and then is irradiated with ultraviolet light such as a g-line (wavelength: 436 nm) or an i-line (wavelength: 365 nm) to be patterned, thereby forming a mask in the shape of prisms having slopes above the respective light-receiving parts 21 which are to receive green light.

Figure 8C:
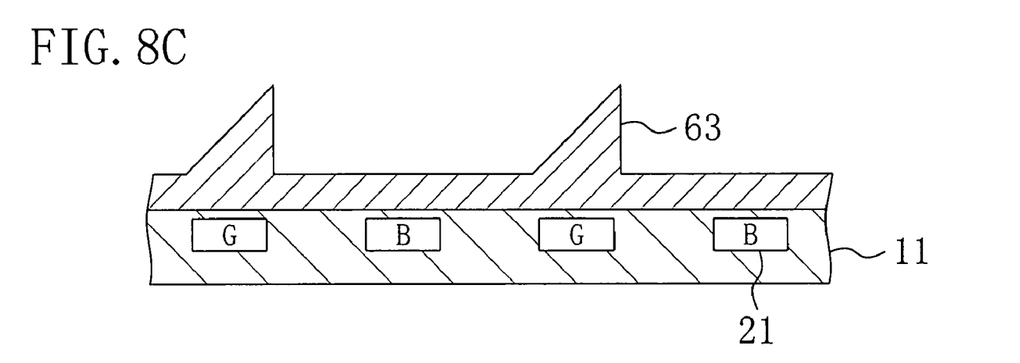

Then, as shown in FIG. 8C, the entire surface is etched back so that the pattern of the synthetic resin film 62 is transferred onto the first prism formation film 61, thereby forming first prisms 63 on the light-receiving parts 21 which are to receive green light.

Figure 9A:
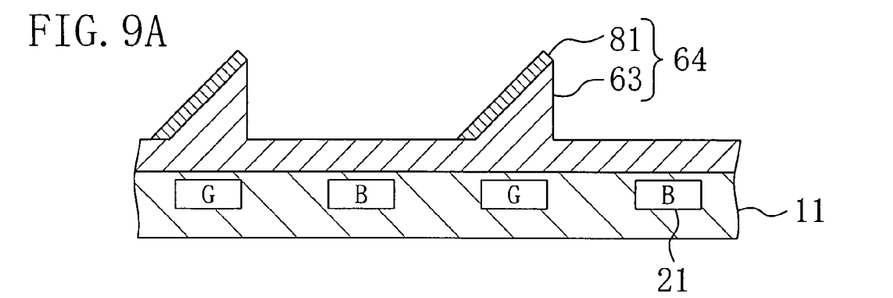
FIGS. 9A through 9C are cross-sectional views showing respective process steps of the method for fabricating a solid-state imaging device of the embodiment in the order of fabrication.
Figure 10A:
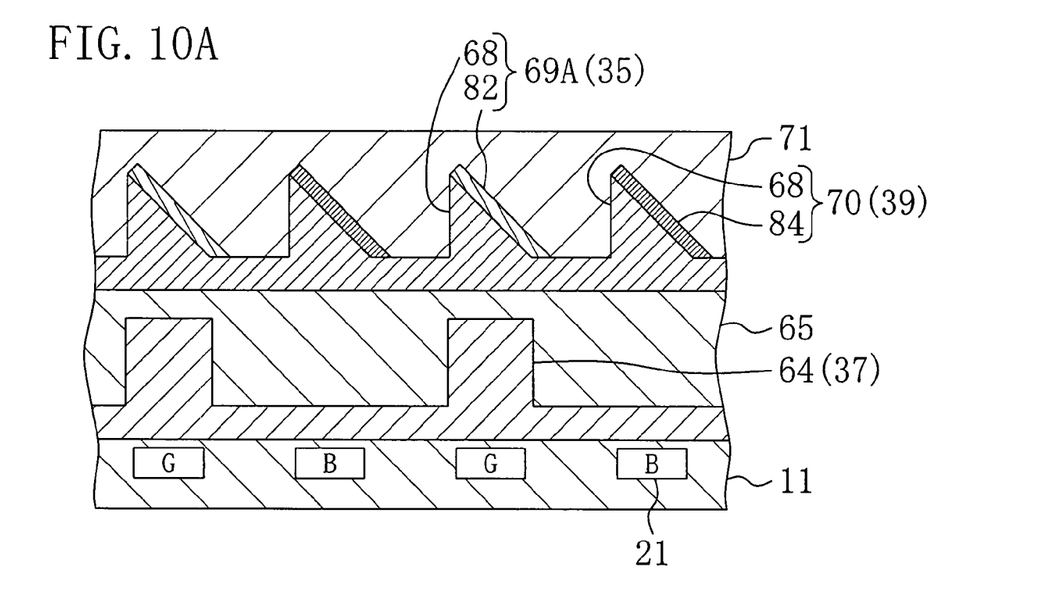
FIG. 10A is a cross-sectional view taken along the line Xa-Xa in FIG. 9C
Figure 10B:
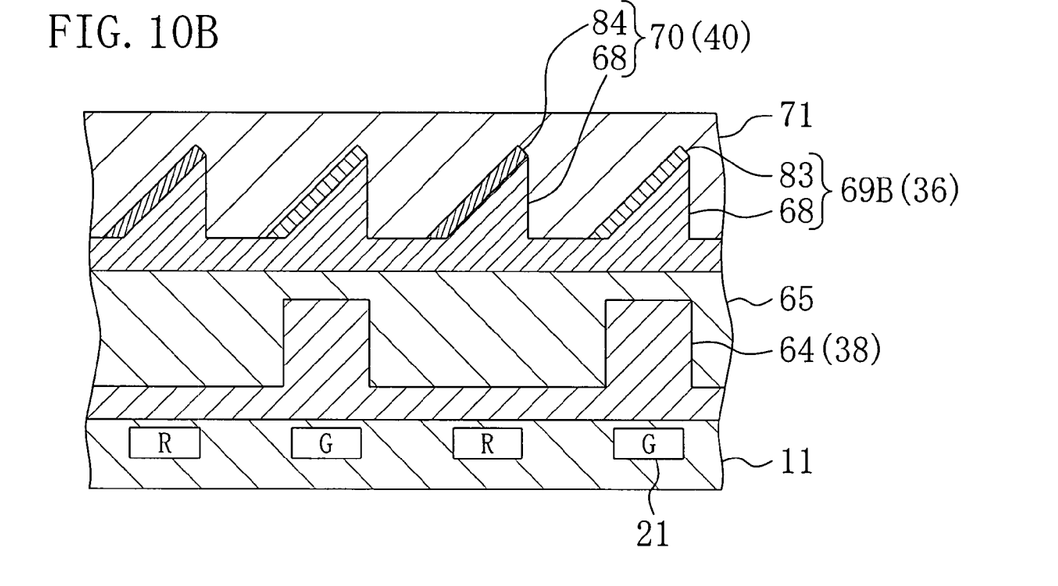
FIG. 10B is a cross-sectional view taken along the line Xb-Xb in FIG. 9C.

Thereafter, as shown in FIG. 9A, a first dielectric film 81 as a stack of $SiO_2$ and $TiO_2$ is formed by, for example, CVD on the slopes of the first prisms 63, thereby forming lower color separating elements 64 serving as a third color-separating element 37 and a fourth color-separating element 38. The first dielectric film 81 is formed as a dichroic mirror which transmits only green light by controlling the amounts of $SiO_2$ and $TiO_2$.

Figure 9B:
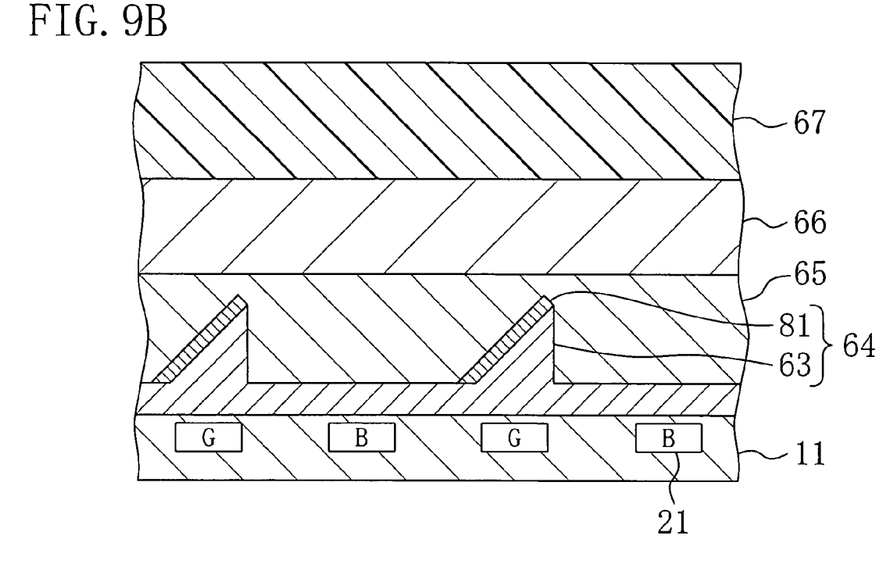

Subsequently, as shown in FIG. 9B, a first intermediate film 65 made of, for example, borophosphosilicate glass (BPSG) and a second prism formation film 66 made of, for example, $SiO_2$ are sequentially formed by, for example, CVD to cover the lower color separating elements 64. Thereafter, a synthetic resin film 67 is formed on the second prism formation film 66.

Figure 9C:
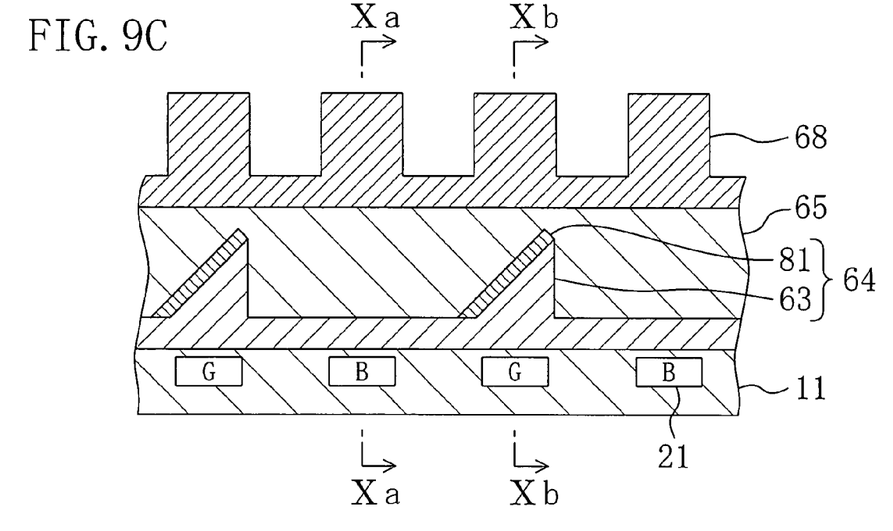

Then, as shown in FIG. 9C, the synthetic resin film 67 is patterned and then the entire surface is etched back, thereby forming second prisms 68 above the respective light-receiving parts 21.

Thereafter, as shown in FIGS. 10A and 10B, a second dielectric film 82 as a stack of $SiO_2$ and $TiO_2$ is deposited on the slopes of the second prisms 68 which are formed above the light-receiving parts 21 for receiving green light and have their slopes located adjacent to the light-receiving parts 21 for receiving blue light. The amount of the second dielectric film 82 is adjusted such that the second dielectric film 82 serves as a dichroic mirror which transmits green light and red light and reflects blue light. In this manner, first upper color-separating elements 69A which are first color-separating elements 35 are formed.

In addition, a third dielectric film 83 as a stack of $SiO_2$ and $TiO_2$ is deposited on the slopes of the second prisms 68 which are formed above the light-receiving parts 21 for receiving green light and have their slopes located adjacent to the light-receiving parts 21 for receiving red light. The amount of the third dielectric film 83 is adjusted such that the third dielectric film 83 serves as a dichroic mirror which transmits green light and blue light and reflects red light. In this manner, second upper color-separating elements 69B which are second color-separating elements are formed.

Furthermore, a fourth dielectric film 84 as a stack of $SiO_2$ and $TiO_2$ is deposited on the slopes of the second prisms 68 which are formed above the light-receiving parts 21 for receiving blue light and red light. The amount of the fourth dielectric film 84 is adjusted such that the fourth dielectric film 84 serves as a total-reflection mirror which reflects light of all colors. In this manner, mirror elements 70 which are a first mirror element 39 and a second mirror element 40 are formed.

Thereafter, a second intermediate film 71 covering the first upper color-separating elements 69A, the second upper color-separating elements 69B and the mirror elements 70 is formed, and then a collimator element 32 and an on-chip microlens 31 are formed by known methods.

In this embodiment, the stack of $SiO_2$ and $TiO_2$ is used as the first through fourth dielectric films 81 through 84. Alternatively, a stack of a low-refractive-index material such as magnesium fluoride ($MgF_2$) and a high-refractive-index material such as tantalum oxide ($Ta_2O_5$) may be used.

As described above, the present invention provides a solid-state imaging device including transmission color filters in a Bayer pattern and a method for fabricating the device. The present invention is useful for a solid-state imaging device including transmission color filters in a Bayer pattern and a method for fabricating the device, for example.

What is claimed is:

1. A solid-state imaging device, comprising:
   a plurality of light-receiving parts arranged in an array in a substrate and performing photoelectric conversion on incident light; and
   a plurality of color separators each provided for adjacent four of the light-receiving parts arranged in two rows and two columns,
   wherein the four light-receiving parts are a first light-receiving part, a second light-receiving part, a third light-receiving part and a fourth light-receiving part,
   each of the color separators includes
      a first optical element part for guiding incident light to a first optical path entering the first light-receiving part,
      a second optical element part for guiding incident light to the fourth light-receiving part located in a row and a column which are different from a row and a column on which the first light-receiving part is located,
      a first color-separating element formed on the first optical path between the first optical element part and the first light-receiving part, reflecting light of one of red, green and blue included in incident light toward the third light-receiving part located in the row on which the first light-receiving part is located and a column different from the column on which the first light-receiving part located, guiding the reflected light to a third optical path crossing the first optical path, and transmitting light of the other two colors,
      a second color-separating element formed on the second optical path between the second optical element part and the fourth light-receiving part, reflecting light of one of red, green and blue included in incident light toward the second light-receiving part located in the column on which the first light-receiving part is located and a row different from the row on which the first light-receiving part is located, guiding the reflected light to a fourth optical path crossing the second optical path, and transmitting light of the other two colors,
      a third color-separating element formed on the first optical path between the first color-separating element and the first light-receiving part, reflecting light of one of two colors included in light which has passed through the first color-separating element, guiding the reflected light to a fifth optical path crossing the first optical path, and allowing light of the other color to pass and enter the first light-receiving part,
      a fourth color-separating element formed on the second optical path between the second color-separating element and the third light-receiving part, reflecting light of one of two colors included in light which has passed through the second color-separating element, guiding the reflected light to a sixth optical path crossing the second optical path, allowing light of the other color to pass and enter the fourth-light-receiving part,
      a first mirror element formed on the third optical path, reflecting light guided to the third optical path, and guiding the reflected light to a seventh optical path entering the third light-receiving part, and
      a second mirror element formed on the fourth optical path, reflecting light guided to the fourth optical path, and guiding the reflected light to an eighth optical path entering the second light-receiving part,
   the color of light reflected by the first color-separating element and the color of light reflected by the second color-separating element differ from each other, and
   the color of light transmitted through the third color-separating element and the color of light transmitted through the fourth color-separating element are identical.

2. The solid-state imaging device of claim 1, wherein the first color-separating element reflects blue light,
   the second color-separating element reflects red light, and
   the third color-separating element and the fourth color-separating element transmit green light.

3. The solid-state imaging device of claim 1, wherein each of the first optical element part and the second optical element part includes:
- a microlens element for focusing incident light; and
- a collimator element for forming light focused by the microlens element into parallel light.

4. The solid-state imaging device of claim 1, wherein the fifth optical path and the eighth optical path intersect,
- the sixth optical path and the seventh optical path intersect,
- a first halfmirror element for transmitting light traveling on the eighth optical path and for reflecting part of light traveling on the fifth optical path to have the reflected light enter the second light-receiving part is formed at an intersection of the fifth optical path and the eighth optical path,
- a second halfmirror element for transmitting light traveling on the seventh optical path and for reflecting part of light traveling on the sixth optical path to have the reflected light enter the third light-receiving part is formed at an intersection of the sixth optical path and the seventh optical path,
- a first light-absorbing part for absorbing light is formed on the fifth optical path at a side opposite the third color-separating element with respect to the first halfmirror element, and
- a second light-absorbing part for absorbing light is formed on the sixth optical path at a side opposite the fourth color-separating element with respect to the second halfmirror element.

5. The solid-state imaging device of claim 1, wherein the fifth optical path and the eighth optical path intersect,
- the sixth optical path and the seventh optical path intersect,
- a first beam splitter element is formed at an intersection of the fifth optical path and the eighth optical path,
- a second beam splitter element is formed at an intersection of the sixth optical path and the seventh optical path,
- a first polarizer is formed on the fifth optical path between the third color-separating element and the first beam splitter element,
- a second polarizer is formed on the sixth optical path between the fourth color-separating element and the second beam splitter element,
- a third polarizer is formed on the seventh optical path between the first mirror element and the second beam splitter element, and
- a fourth polarizer is formed on the eighth optical path between the second mirror element and the first beam splitter element.

6. The solid-state imaging device of claim 1, further comprising:
- a first light-blocking film formed around each of the color separators; and
- a second light-blocking film formed in regions where the color separators are provided and preventing transmission of light in regions other than the first optical path, the second optical path, the third optical path, the fourth optical path, the fifth optical path, the sixth optical path, the seventh optical path and the eighth optical path.

7. The solid-state imaging device of claim 6, wherein the second light-blocking film is made of one of a material which absorbs light and a material which reflects light.

8. The solid-state imaging device of claim 6, wherein an intermediate film transmitting light is formed in regions of each of the color separators serving as the first optical path, the second optical path, the third optical path, the fourth optical path, the fifth optical path, the sixth optical path, the seventh optical path and the eighth optical path,
- the second light-blocking film is made of a material having a refractive index lower than that of the intermediate film, and
- the intermediate film serves as a light waveguide.

9. The solid-state imaging device of claim 1, further comprising:
- a first primary-color filter formed between the third color-separating element and the first light-receiving part and associated with the color of light incident on the first light-receiving part;
- a second primary-color filter formed between the first mirror element and the second light-receiving part and associated with the color of light incident on the second light-receiving part;
- a third primary-color filter formed between the second mirror element and the third light-receiving part and associated with the color of light incident on the third light-receiving part; and
- a fourth primary-color filter formed between the fourth color-separating element and the fourth light-receiving part and associated with the color of light incident on the fourth light-receiving part.

* * * * *